United States Patent [19]

Tsudaka

[11] Patent Number: 5,736,280
[45] Date of Patent: Apr. 7, 1998

[54] METHOD OF ESTIMATION OF RESIST PATTERN AND METHOD OF EXPOSURE BASED ON SAME

[75] Inventor: Keisuke Tsudaka, Kanagawa, Japan

[73] Assignee: Sony Corporation, Tokyo, Japan

[21] Appl. No.: 558,676

[22] Filed: Nov. 16, 1995

[30] Foreign Application Priority Data

Nov. 16, 1994 [JP] Japan .................... 6-281749

[51] Int. Cl.$^6$ .................... G03C 5/00; G03F 9/00
[52] U.S. Cl. .................... 430/30; 430/5
[58] Field of Search .................... 430/5, 30

[56] References Cited

U.S. PATENT DOCUMENTS

| | | | |
|---|---|---|---|
| 5,316,896 | 5/1994 | Fukuda et al. | 430/5 |
| 5,415,952 | 5/1995 | Haruki et al. | 430/30 |
| 5,434,026 | 7/1995 | Takatsu et al. | 430/30 |

*Primary Examiner*—Christopher G. Young
*Attorney, Agent, or Firm*—Hill, Steadman & Simpson

[57] ABSTRACT

A method of estimation of a resist pattern which calculates a resist pattern formed by projecting a mask pattern on a resist on a wafer by exposure and then developing it, comprised of a step of calculating a 2D light intensity of the exposure light projected on the wafer based on the mask pattern and the exposure conditions, a step of using the light intensities at peripheral positions of any position noted on the 2D plane of the wafer and the distance between the noted position and the peripheral positions as a basis for calculating and cumulatively adding the effect of the light intensities at a plurality of the peripheral positions on the exposure energy at the any noted position, a step of calculating a latent image formation intensity at the any noted position for the 2D plane of the wafer, a step of finding the distribution of the latent image formation intensity in the 2D plane of the wafer, a step of determining a threshold value of the latent image formation intensity corresponding to the amount of exposure and the development conditions, and a step of finding a contour at the threshold value for the distribution of the latent image formation intensity, the pattern defined by the contour being estimated as the resist pattern. Also, a method of exposure based on the same.

13 Claims, 12 Drawing Sheets

α : 0.131   Eth : 197.01   3σ : 0.0153

| DEFOCUS (μm) | EXPOSURE TIME (sec) | SEM (μm) | PRESENT INVENTION'S RESULT (μm) | DIFFERENCE (μm) |
|---|---|---|---|---|
| 0 | 475 | 0.482 | 0.472 | -0.01 |
| 0 | 500 | 0.458 | 0.449 | -0.009 |
| 0 | 525 | 0.437 | 0.429 | -0.008 |
| 0 | 550 | 0.412 | 0.412 | 0 |
| 0 | 575 | 0.394 | 0.395 | 0.001 |
| 0 | 600 | 0.38 | 0.38 | 0 |
| 0 | 625 | 0.336 | 0.366 | 0 |
| 0 | 650 | 0.357 | 0.353 | -0.004 |
| 0 | 675 | 0.347 | 0.34 | -0.006 |
| 0 | 700 | 0.333 | 0.329 | -0.004 |
| 0 | 725 | 0.322 | 0.319 | -0.003 |
| -1 | 555 | 0.408 | 0.414 | 0.006 |
| -0.8 | 555 | 0.404 | 0.411 | 0.007 |
| -0.6 | 555 | 0.404 | 0.41 | 0.006 |
| -0.4 | 555 | 0.403 | 0.409 | 0.006 |
| -0.2 | 555 | 0.402 | 0.408 | 0.006 |
| 0 | 555 | 0.405 | 0.408 | 0.003 |
| 0.2 | 555 | 0.41 | 0.408 | -0.002 |
| 0.4 | 555 | 0.407 | 0.409 | 0.002 |
| 0.6 | 555 | 0.406 | 0.41 | 0.004 |
| 0.8 | 555 | 0.413 | 0.411 | -0.002 |

α : 0.149   Eth : 135.46   3σ : 0.0352

| DEFOCUS (μm) | EXPOSURE TIME (sec) | SEM (μm) | PRESENT INVENTION'S RESULT (μm) | DIFFERENCE (μm) |
|---|---|---|---|---|
| 0 | 300 | 0.542 | 0.521 | -0..021 |
| 0 | 320 | 0.471 | 0.487 | 0.016 |
| 0 | 340 | 0.441 | 0.458 | 0.017 |
| 0 | 360 | 0.42 | 0.432 | 0.012 |
| 0 | 380 | 0.392 | 0.409 | 0.017 |
| 0 | 400 | 0.368 | 0.389 | 0.021 |
| 0 | 420 | 0.354 | 0.371 | 0.017 |
| 0 | 440 | 0.34 | 0.354 | 0.014 |
| 0 | 460 | 0.331 | 0.338 | 0.007 |
| 0 | 480 | 0.315 | 0.323 | 0.008 |
| 0 | 500 | 0.302 | 0.31 | 0.008 |
| 0 | 520 | 0.295 | 0.296 | 0.001 |
| 0 | 540 | 0.286 | 0.284 | -0.002 |
| 0 | 560 | 0.279 | 0.272 | -0.007 |
| 0 | 580 | 0.271 | 0.261 | -0.01 |
| 0 | 600 | 0.255 | 0.251 | -0.004 |
| -0.8 | 390 | 0.417 | 0.399 | -0.018 |
| -0.6 | 390 | 0.417 | 0.399 | -0.018 |
| -0.4 | 390 | 0.406 | 0.399 | -0.007 |
| -0.2 | 390 | 0.404 | 0.399 | -0.005 |
| 0 | 390 | 0.402 | 0.399 | -0.003 |
| 0.2 | 390 | 0.396 | 0.399 | 0.003 |
| 0.4 | 390 | 0.401 | 0.399 | -0.002 |
| 0.6 | 390 | 0.403 | 0.399 | -0.004 |
| 0.8 | 390 | 0.409 | 0.399 | -0.01 |
| 1 | 390 | 0.405 | 0.399 | -0.007 |

Eth : 193.54    3σ : 0.0313

| DEFOCUS (μm) | EXPOSURE TIME (sec) | SEM (μm) | PRESENT INVENTION'S RESULT (μm) | DIFFERENCE (μm) |
|---|---|---|---|---|
| 0 | 475 | 0.482 | 0.454 | -0.028 |
| 0 | 500 | 0.458 | 0.437 | -0.021 |
| 0 | 525 | 0.437 | 0.422 | -0.015 |
| 0 | 550 | 0.412 | 0.409 | -0.003 |
| 0 | 575 | 0.394 | 0.397 | 0.003 |
| 0 | 600 | 0.38 | 0.385 | 0.005 |
| 0 | 625 | 0.336 | 0.375 | 0.009 |
| 0 | 650 | 0.357 | 0.365 | 0.008 |
| 0 | 675 | 0.347 | 0.356 | 0.009 |
| 0 | 700 | 0.333 | 0.347 | 0.014 |
| 0 | 725 | 0.322 | 0.339 | 0.017 |
| -1 | 555 | 0.408 | 0.411 | 0.003 |
| -0.8 | 555 | 0.404 | 0.409 | 0.005 |
| -0.6 | 555 | 0.404 | 0.408 | 0.004 |
| -0.4 | 555 | 0.403 | 0.407 | 0.004 |
| -0.2 | 555 | 0.402 | 0.407 | 0.005 |
| 0 | 555 | 0.405 | 0.406 | 0.001 |
| 0.2 | 555 | 0.41 | 0.407 | -0.003 |
| 0.4 | 555 | 0.407 | 0.407 | 0 |
| 0.6 | 555 | 0.406 | 0.408 | 0.002 |
| 0.8 | 555 | 0.413 | 0.409 | -0.004 |

Eth : 130.45   3σ : 0.0738

| DEFOCUS (μm) | EXPOSURE TIME (sec) | SEM (μm) | PRESENT INVENTION'S RESULT (μm) | DIFFERENCE (μm) |
|---|---|---|---|---|
| 0 | 300 | 0.542 | 0.476 | -0.066 |
| 0 | 320 | 0.471 | 0.454 | -0.017 |
| 0 | 340 | 0.441 | 0.435 | -0.006 |
| 0 | 360 | 0.42 | 0.417 | -0.003 |
| 0 | 380 | 0.392 | 0.402 | 0.01 |
| 0 | 400 | 0.368 | 0.388 | 0.02 |
| 0 | 420 | 0.354 | 0.376 | 0.022 |
| 0 | 440 | 0.34 | 0.364 | 0.024 |
| 0 | 460 | 0.331 | 0.353 | 0.022 |
| 0 | 480 | 0.315 | 0.343 | 0.028 |
| 0 | 500 | 0.302 | 0.334 | 0.032 |
| 0 | 520 | 0.295 | 0.325 | 0.03 |
| 0 | 540 | 0.286 | 0.317 | 0.031 |
| 0 | 560 | 0.279 | 0.309 | 0.03 |
| 0 | 580 | 0.271 | 0.302 | 0.031 |
| 0 | 600 | 0.255 | 0.295 | 0.04 |
| -0.8 | 390 | 0.417 | 0.393 | -0.024 |
| -0.6 | 390 | 0.417 | 0.394 | -0.023 |
| -0.4 | 390 | 0.406 | 0.395 | -0.011 |
| -0.2 | 390 | 0.404 | 0.395 | -0.009 |
| 0 | 390 | 0.402 | 0.395 | -0.007 |
| 0.2 | 390 | 0.396 | 0.395 | -0.001 |
| 0.4 | 390 | 0.401 | 0.395 | -0.006 |
| 0.6 | 390 | 0.403 | 0.394 | -0.009 |
| 0.8 | 390 | 0.409 | 0.393 | -0.016 |
| 1 | 390 | 0.405 | 0.392 | -0.013 |

5,736,280

1

METHOD OF ESTIMATION OF RESIST PATTERN AND METHOD OF EXPOSURE BASED ON SAME

BACKGROUND OF THE INVENTION

1. Field of the Invention

The present invention relates to a method of estimation of a resist pattern and a method of exposure based on the same used in a photolithographic process in the fabrication of a semiconductor device etc.

2. Description of the Related Art

In the fabrication of a semiconductor device, etc., use is made of a photolithographic process to form extremely fine patterns of several tenth μm in size. In such a photolithographic process, light is projected through a mask pattern on which a predetermined design pattern is drawn and strikes a resist material formed on a semiconductor wafer to expose the material and thereby form a resist pattern.

In recent years, the increased miniaturization of the semiconductor devices fabricated has led to a need for improvement of the resolution, even in the photolithographic process. That is, to increase the yield in the fabrication of semiconductor devices, it is necessary to find the optimal exposure conditions to enable an increase of the process margin. Further, the reduction of the design rule down to a size close to the wavelength of the light used means that the resolution in the lithographic process is becoming insufficient. The discrepancy between the mask pattern and the transferred resist pattern becomes a problem as a result.

Accordingly, it has become necessary to accurately determine what kind of resist pattern will be formed under particular conditions so as to enable determination of the optimum conditions for the photolithographic process.

In this case, the most accurate method is to actually experiment with the transfer of the pattern. Performing experiments several times under different conditions to try to find the optimum conditions among them, however, requires tremendous time and cost. It is therefore not practical to find the optimum conditions by transfer experiments alone. Further, at the present time, there is a shortage of the required facilities etc., which makes experimenting with transfers of patterns impossible. It will therefore not be possible to properly evaluate the photolithographic processes expected to be introduced in the future.

For these reasons, one of the methods used for finding resist patterns in the past has been to utilize light intensity simulators, light intensity measurement apparatuses, development simulators, etc. along with transfer experiments.

FIGS. 1 to 4 are flow charts for explaining some conventional methods of finding a resist pattern.

In the first method, as shown in FIG. 1, a mask pattern 1 and transfer conditions 2 are input to a light intensity simulator 3 from which a light intensity distribution 4 is then output. The light intensity distribution 4 is input to a development simulator 5 from which a resist pattern 6 is then output. At the development simulator, the resist pattern is estimated by estimating the shape of the resist over time by the finite-elementary calculation method.

In the second method, as shown in FIG. 2, a mask 9 and transfer conditions 2 are input to a light intensity measurement apparatus 7 from which a light intensity distribution 8 is then output. The light intensity distribution 8 is input to a development simulator 5 from which a resist pattern 10 is then output.

In the third method, as shown in FIG. 3, a mask pattern 1 and transfer conditions 2 are input to a light intensity

2 simulator 3 from which a light intensity distribution 4 is then output. The contour at the threshold value in the light intensity distribution 4 is found ("11" in the figure), and the resist pattern 12 is prepared based on that contour.

In the fourth method, as shown in FIG. 4, a mask 9 and transfer conditions 2 are input to a light intensity measurement apparatus 7 from which a light intensity distribution 8 is then output. The contour at the threshold value in the light intensity distribution 8 is found ("11" in the figure) and the resist pattern 13 is prepared based on that contour.

In the above first and second methods, however, since computations were performed by the finite-elementary calculation method at the development simulator 5, there was the problem of a remarkably long time being taken for computations at the development simulator 5. Accordingly, tremendous time and cost were required when performing a large number of computations under different conditions. Therefore, the first and second methods were unsuitable when a large number of calculations were required for finding the optimum mask pattern and exposure conditions.

Furthermore, in the third and fourth methods, further, when finding the contour ("11" in FIG. 4) at the threshold value of the light intensity distribution 8, the thickness of the resist and the development properties of the resist were ignored, so there was the problem of a large discrepancy between the resist pattern found using the simulator and the actually prepared resist pattern. For example, when performing an exposure using the mask pattern shown in FIG. 10, the conventional method of estimation of a resist pattern gives the resist pattern shown in FIG. 5, but the resist pattern shown in FIG. 12 actually results. A comparison of the resist pattern shown in FIG. 5 and the resist pattern shown in FIG. 12 shows that the pattern 50 and the pattern 52 do not match in shape and the pattern 51 and pattern 53 differ in line width.

Therefore, in the third and fourth methods, there was a tendency for the line width L of the actually formed resist pattern to be greater than the line width 1 obtained by simulation by the threshold value Eth when the peak of the light intensity distribution was high as shown in FIG. 6A, and conversely for the line width L of the actually obtained resist pattern to be smaller when the peak of the light intensity distribution was low, as shown in FIG. 6B.

SUMMARY OF THE INVENTION

The present invention was made in consideration of the above problems in the related art and has as its object the provision of a method of estimation of a resist pattern and a method of exposure based on the same which enable highly precise estimation of a resist pattern at a high speed and with a low cost.

The present inventors studied methods of estimating resist patterns with high precision, high speed, and low cost and as a result made the following new discovery leading to the completion of the present invention.

That is, the inventors considered the results shown in FIGS. 6A and 6B and noticed that the line width 1 in the resist pattern using the threshold value Eth obtained by the conventional method of estimation of a resist pattern was smaller than the line width L of the actually obtained resist pattern when the peak of the light intensity distribution was high as shown in FIG. 6A, and conversely was larger than the line width L of the actually obtained resist pattern when the peak of the light intensity distribution was low as shown in FIG. 6B. The present inventors, considering this point, discovered that the elements contributing to the formation of a resist pattern at any particularly noted point included not only the light intensity of that point, but also the light intensities of the points around that point.

The present inventors came up with the new concept of a "latent image forming intensity" based on the above discovery, and estimated resist patterns by finding their distributions of latent image formation intensity and setting threshold values. As a result, they found that there was an extremely good match between these results and actually obtained resist patterns.

Here, the "latent image formation intensity" includes not only the light intensity at any noted position, but also the effects of the light intensities of peripheral positions on the exposure energy of that any noted position.

According to a first aspect of the present invention, there is provided a method of estimation of a resist pattern which estimates a resist pattern formed by projecting a mask pattern on a resist on a wafer by exposure and then developing it, comprised of a step of calculating a 2D light intensity of the exposure light projected on the wafer based on the mask pattern and the exposure conditions, a step of using the light intensities at peripheral positions of any position noted on the 2D plane of the wafer and the distance between the noted position and the peripheral positions as a basis for calculating and cumulatively adding the effects of the light intensities at a plurality of the peripheral positions on the exposure energy at the any noted position, a step of calculating a latent image formation intensity at that any noted position for the 2D plane of the wafer, a step of finding the distribution of the latent image formation intensity in the 2D plane of the wafer, a step of determining a threshold value of the latent image formation intensity corresponding to an amount of exposure and development conditions, and a step of finding a contour at the threshold value for the distribution of the latent image formation intensity, the pattern defined by the contour being estimated as the resist pattern.

According to a second aspect of the present invention, there is provided a method of exposure for projecting a mask pattern on a resist on a wafer by exposure, comprised of a step of using light intensities at peripheral positions of any position noted on the 2D plane of the wafer and the distance between the noted position and the peripheral positions as a basis for calculating and cumulatively adding the effects of the light intensities at a plurality of the peripheral positions on the exposure energy at the any noted position, a step of calculating a latent image formation intensity at that any noted position for the 2D plane of the wafer, a step of finding the distribution of the latent image formation intensity in the 2D plane of the wafer, a step of determining a threshold value of the latent image formation intensity corresponding to an amount of exposure and the development conditions, a step of finding a contour at the threshold value for the distribution of the latent image formation intensity, a step of estimating the pattern defined by the contour as the desired resist pattern, and a step of determining at least one of the mask pattern and exposure conditions so that the estimated resist pattern becomes close to the desired resist pattern.

BRIEF DESCRIPTION OF THE DRAWINGS

These and other objects and features of the present invention will become clearer from the following description of the preferred embodiments given with reference to the drawings, wherein.

DESCRIPTION OF THE PREFERRED EMBODIMENTS

The method of estimation of a resist pattern and the method of exposure of preferred embodiments of the present invention will be explained below.

First Aspect

Figure 1:
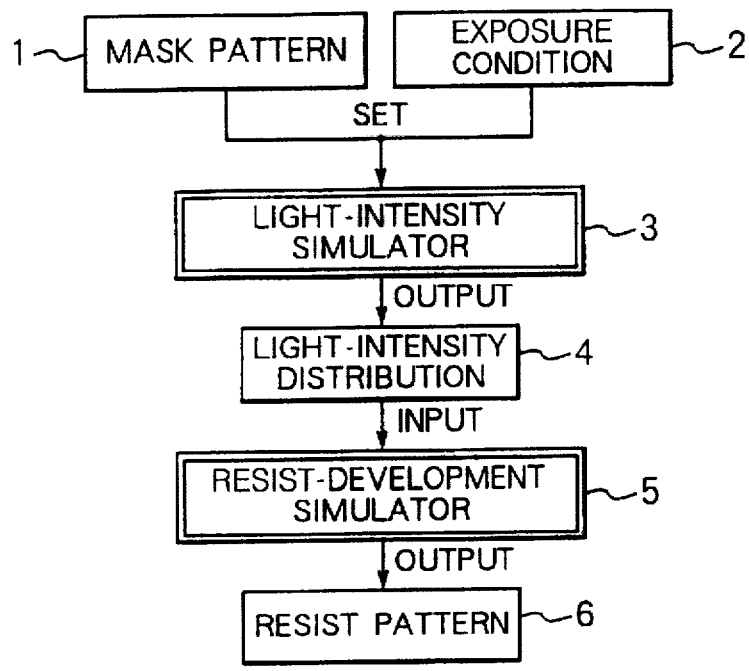
FIG. 1 is a flow chart for explaining a conventional method of finding a resist pattern.
Figure 2:
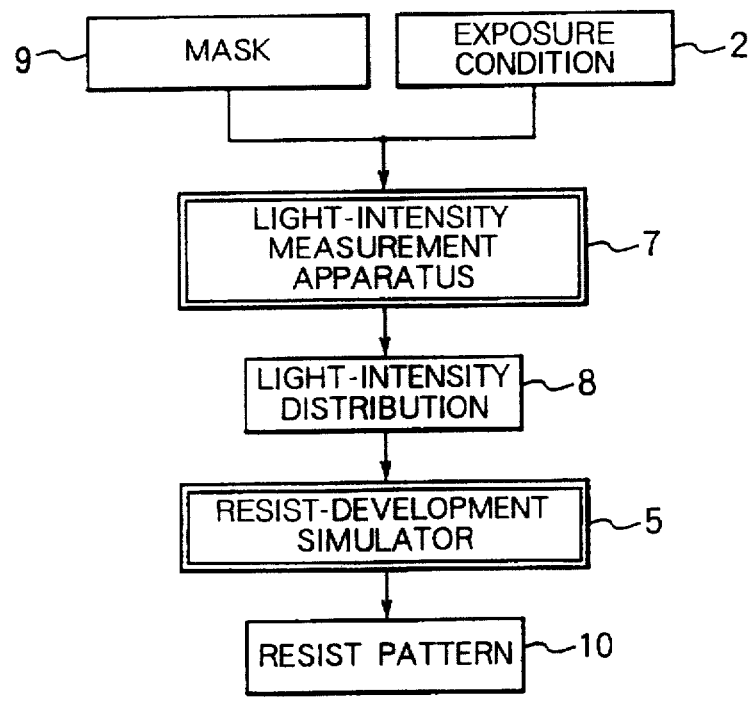
FIG. 2 is a flow chart for explaining another conventional method of finding a resist pattern.
Figure 3:
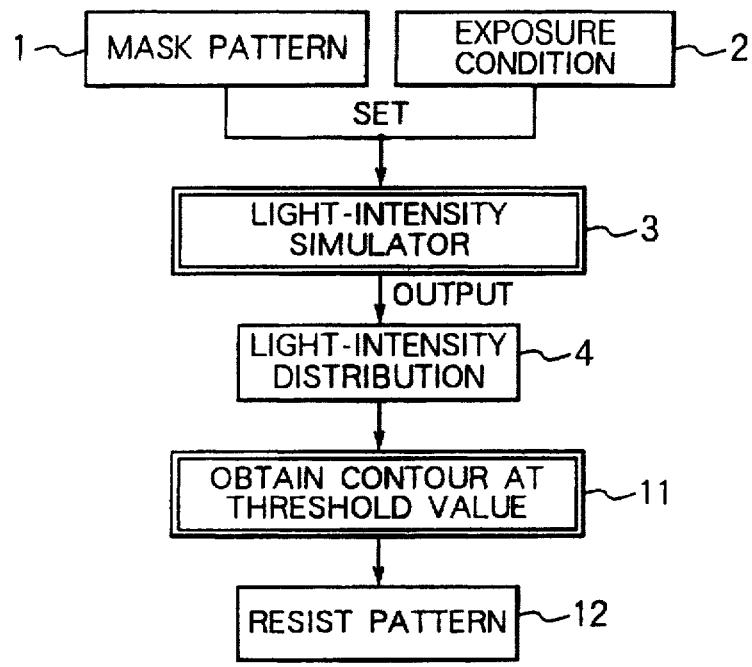
FIG. 3 is a flow chart for explaining still another conventional method of finding a resist pattern.
Figure 4:
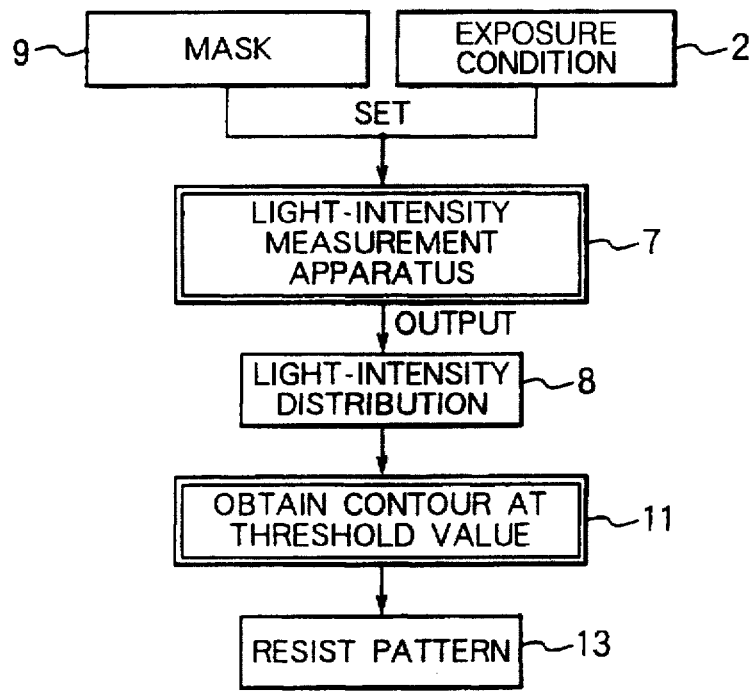
FIG. 4 is a flow chart for explaining yet another conventional method of finding a resist pattern.
Figure 5:
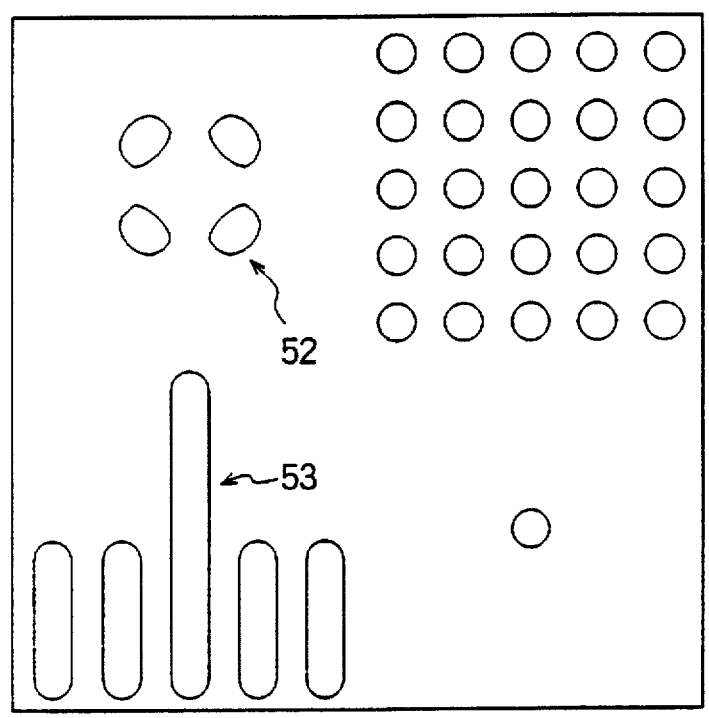
FIG. 5 is a view for explaining a resist pattern obtained by a conventional method of estimating a resist pattern.
Figure 6A:
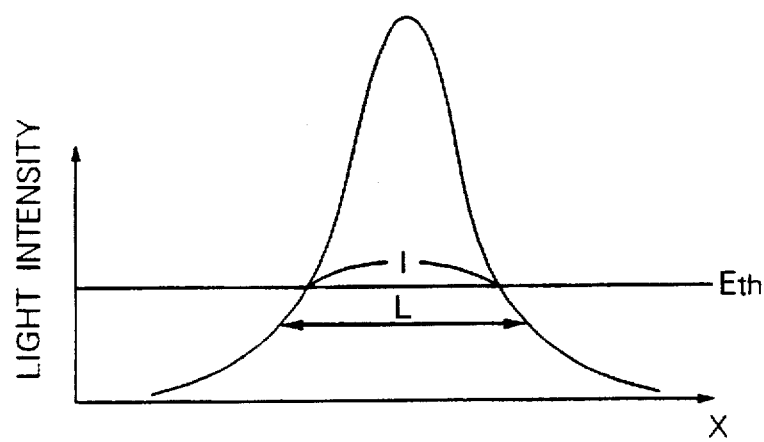
FIGS. 6A and 6B are views for explaining problems in the conventional methods of calculating a resist pattern.
Figure 6B:
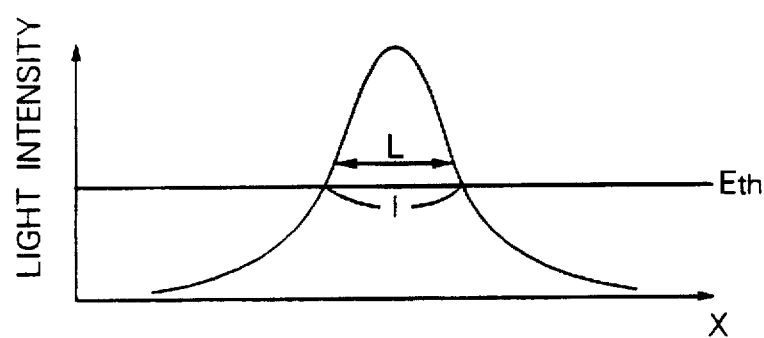
Figure 7:
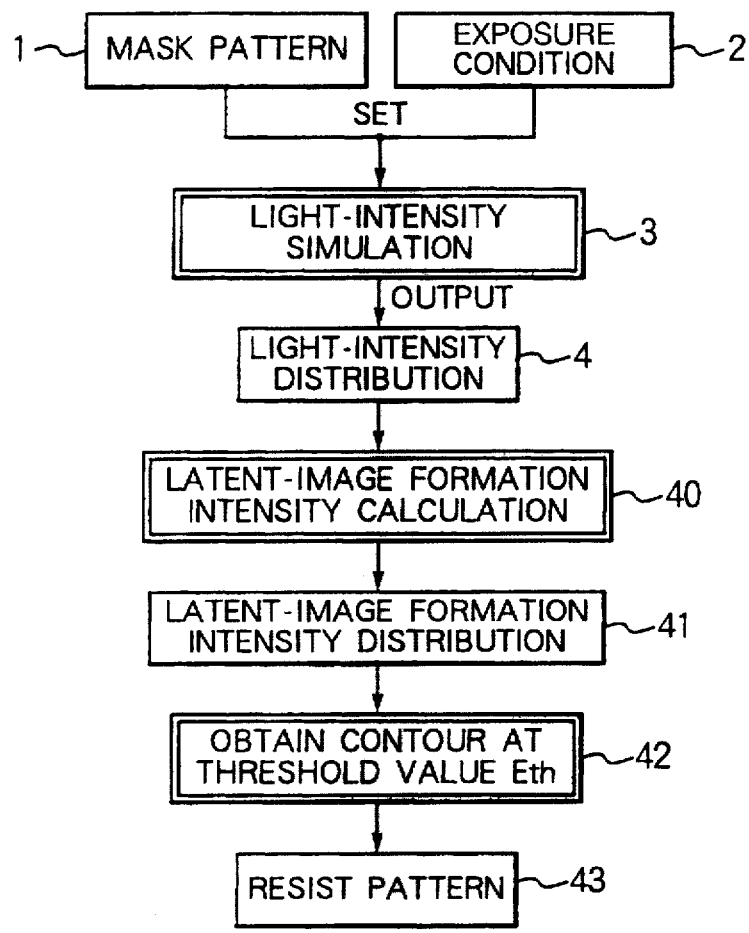
FIG. 7 is a flow chart for explaining the concept of the method of estimating a resist pattern according to a first aspect of the present invention.

FIG. 7 is a flow chart for explaining the concept of the method of estimating a resist pattern according to the present invention.

As shown in FIG. 7, information on the mask pattern 1 and the exposure conditions 2 is input to the light intensity simulation unit 3 from which the light intensity distribution 4 is then output. Furthermore, the light intensity distribution 4 may be found using a light intensity measurement apparatus.

The transfer conditions 2 are, for example, the wavelength $\lambda$ of the light used for the exposure, the numerical aperture NA, the apparent magnitude of the light source, that is, the partial coherence $\sigma$, the distribution of transmittance of the light source, the phase and the distribution of transmittance of the exit pupil, and the defocus conditions.

The light intensity distribution 4 shows the 2D light intensity in the wafer plane.

The light intensity distribution 4 is input to a latent image formation intensity calculation unit 40 from which the latent image formation intensity distribution 41 is then output.

The processing at the latent image formation intensity calculation unit 40 will be explained in more detail below.

Figure 8:
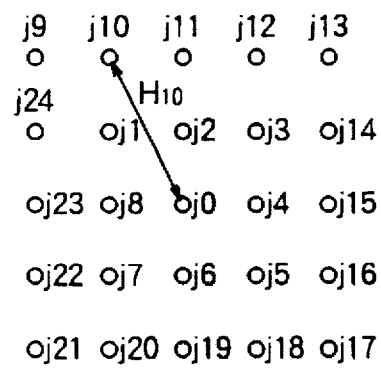
FIG. 8 is a view for explaining the technique for calculating the latent image formation intensity in the method of estimating a resist pattern shown in FIG. 7.

In the latent image formation intensity calculation unit 40, for example, the latent image formation intensity $M_{jo}$ at a point jo in the wafer plane shown in FIG. 8 is determined by considering the effect of the light intensity at the point jo and the points positioned at the periphery of the point jo, that is, the points jn (n being an integer satisfying $0 \leq n \leq 24$). Here, the effect $M_{jojn}$ of the light intensities at the points jn is defined by the following expression (1):

$$M_{jojn} = f(rn) * g(I(jn)) \quad (1)$$

In the above expression (1), rn indicates the distance between the point jo and the points jn. f(rn) is expressed by the following expression (2):

$$f(rn) = K * \exp(-rn^2/\alpha^2) \quad (2)$$

In expression (1), g(I(jn)) is defined by the following expression (4):

$$g(I(jn)) = I(jn) \quad (4)$$

That is, the effect $M_{jojn}$ of the light intensities at the points jn is the product of the multiplication of the light intensities I(jn) of the points jn with the distance rn between the point jo and the points jn.

In the latent image formation intensity calculation unit 40, for example, the latent image formation intensity $M_{jo}$ is found by cumulatively adding the effects $M_{jojn}$ of the light intensities at the points jn on the exposure energy at the point jo.

At this time, for example, considering the case where the size of the wafer is infinitely large in the 2D direction and, in accordance with this, considering the effects of the light intensities from the infinite number of points jn ($-\infty \leq n \leq \infty$) disposed in a predetermined pattern, $M_{jo}$ is expressed by the following expression (5):

$$M_{jo} = \int\int_{-\infty}^{\infty} M_{jojn} dx dy \quad (5)$$
$$= \int\int_{-\infty}^{\infty} f(rn) * g(L(jn)) dx dy$$

Here, if expressions (2) and (4) are inserted into expression (5), $M_{jo}$ is defined by expression (6):

$$M_{jo} = \int\int_{-\infty}^{\infty} K * \exp(-rn^2/\alpha^2) * I(j) dx dy \quad (6)$$

The latent image formation intensity calculation unit 40 calculates the $M_{jo}$ at the points disposed in a predetermined pattern in a 2D plane of the wafer, and based on the results of the calculation finds the latent image formation intensity distribution 41 in the 2D plane.

Next, the contour where the latent image formation intensity becomes the threshold value in the latent image formation intensity distribution 41 found by the above procedure is found and the pattern defined by that contour is used as the resist pattern 43. At this time, the threshold value is determined in accordance with the amount of exposure and the development conditions, for example.

In this aspect of the invention, repeated calculations are performed in accordance with the flow shown in FIG. 7 to determine the optimum mask pattern and exposure conditions giving a resist pattern obtained by estimation matching the desired resist pattern. Next, the exposure is performed using the thus determined mask pattern and exposure conditions.

The mask pattern and exposure conditions are determined at this time by, for example, performing the calculation shown in FIG. 7 using the predetermined constant $\alpha$ and threshold value Eth as initial values and finding the difference in the line width, for example, between the desired results and the currently found results. The next employed mask pattern and exposure conditions are determined so as to make that difference smaller and the estimation is performed using those determined mask pattern and exposure conditions. This procedure is repeated until the difference becomes less than a predetermined value. That mask pattern and exposure conditions are then determined to be the optimum mask pattern and exposure conditions.

The exposure conditions are, for example, the conditions of the wavelength $\lambda$ of the light used for the exposure, the numerical aperture NA, the apparent magnitude of the light source, that is, the partial coherence $\sigma$, and the resist material.

In this procedure, the mask pattern to be next employed is obtained by addition of a predetermined modified pattern to the previously found mask pattern, correction of the line width, addition of a subresolution pattern, correction of the equalization rate and phase correction of the phase shift mask, etc.

According to the method of estimation of a resist pattern and method of exposure of the above first aspect of the invention, it is possible to perform the processing at a higher speed and therefore at a lower cost, compared with the previously mentioned third and fourth conventional methods.

Further, according to the method of estimation of a resist pattern and method of exposure of the above first aspect of the invention, it is possible to estimate a more accurate resist pattern since the latent image formation intensity distribution used at the time of finding of the resist pattern is determined, considering not only the light intensity of any particular noted point, but also the effects of the light intensities of the peripheral points.

Second Aspect

Figure 9:
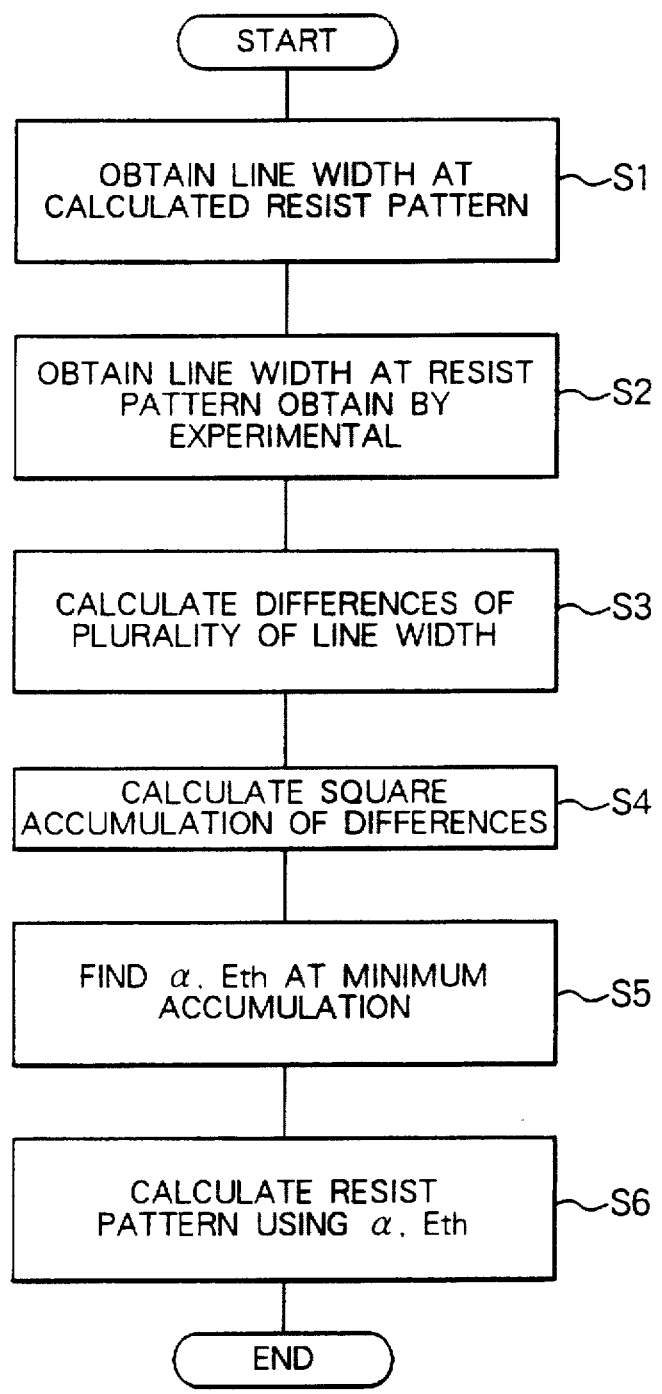
FIG. 9 is a flow chart for explaining the concept of the method of estimating a resist pattern according to a second aspect of the present invention.

FIG. 9 is a flow chart for explaining the concept of the method of estimating a resist pattern according to a second aspect of the present invention.

In this aspect of the invention, a plurality of resist patterns are estimated by the method of the first aspect of the invention explained above under, for example, various exposure times and then defocus conditions, and those estimated resist patterns are used to perform the processing shown in FIG. 9.

Here, the latent image formation intensity R(x,y) in the latent image formation intensity distribution 41 shown in FIG. 7 is defined by expression (7). In expression (7), $\alpha$ is a constant.

$$R(x,y) = \int\int_{-\infty}^{\infty} e^{-\{(x-xo)^2+(y-yo)^2\}/\alpha^2} * E(xo,yo) dxo dyo \quad (7)$$

At step S1, the line widths at a number of locations are found in the resist patterns estimated by the method of estimation of a resist pattern according to the first aspect of the invention. At this time, the lines examined are made with a broad range of line widths.

At step S2, transfer experiments are performed using the same mask patterns and exposure conditions as with the method of estimation of a resist pattern according to the first aspect of the invention to find the line widths of the lines corresponding to the lines examined at step S1.

At step S3, the differences between the line widths of the plurality of lines found at steps S1 and S2 of the resist patterns obtained by the method of estimation and the transfer experiments are found.

At step S4, the squares of the differences found at step S3 are found and the squares are cumulatively added for the plurality of lines to find the cumulative sum.

At step S5, the constant $\alpha$ and threshold value Eth giving the smallest cumulative sum found at step S4 are calculated. The constant $\alpha$ and threshold value Eth are determined at this time by, for example, performing an estimation of a resist pattern shown in FIG. 7 and the processing of steps S1 to S4 of FIG. 9 using a predetermined constant $\alpha$ and threshold value Eth as initial values, comparing the cumulative sum of step S4 shown in FIG. 9 of the previous processing with the cumulative sum of step S4 in the current processing, and determining the constant $\alpha$ and threshold value Eth used for the next processing so as to reduce the difference in cumulative sums. The processing of steps S1 to S4 of FIG. 7 and FIG. 9 is repeated using this constant $\alpha$ and threshold value Eth. This processing is repeated until the constant $\alpha$ and threshold value Eth is found which gives the smallest difference in cumulative sums.

At step S6, use is made of the expression (7) with the constant $\alpha$ and Eth made the values calculated at step S5, and the resist pattern is then estimated according to the first aspect of the invention, shown in FIG. 7.

According to the method of estimation of the resist pattern and method of exposure of the second aspect of the invention, it is possible to suitably set the constant $\alpha$ and Eth in expression (7) used when calculating the latent image foundation intensity. Therefore, it is possible to improve the accuracy of the estimation of the resist pattern.

The present invention is not limited to the above aspects. For example, it is also possible to calculate the constant $\alpha$ and the constant Eth to give the smallest maximum value of the difference in line widths of a plurality of corresponding positions between the resist pattern obtained by the method of estimation of a resist pattern and the resist pattern found by experimentation.

Further, in the first aspect of the invention explained above, the illustration was made of the case of using Gaussian functions in expressions (2) and (3) used in the latent image formation intensity calculation unit 40 shown in FIG. 7, but the functions are not particularly limited so long as they become maximum when the distance r is 0 and become 0 when the distance is infinite.

Further, in the first aspect of the invention, in the latent image formation intensity calculation unit 40 shown in FIG. 7, the latent image formation intensity was defined using the product of the light intensity and distance, but the latent image formation intensity may also be defined by the product of the square of the light intensity and the distance.

In this case, the $M_{jo}$ is defined for example by expression (8):

$$M_{jo} = \int\int_{-\infty}^{\infty} K * \exp(-rn^2/\alpha^2) * I(j)^2 dx dy \quad (8)$$

In the above embodiment, illustration was made of the case of exposure using i-rays, but the present invention can also be applied to the case of pattern formation using, for example, x-rays or EB (electron beams).

Below, the present invention will be explained with reference to more detailed examples. The present invention is not, however, limited by these examples in any way.

EXAMPLE 1

Figure 10:
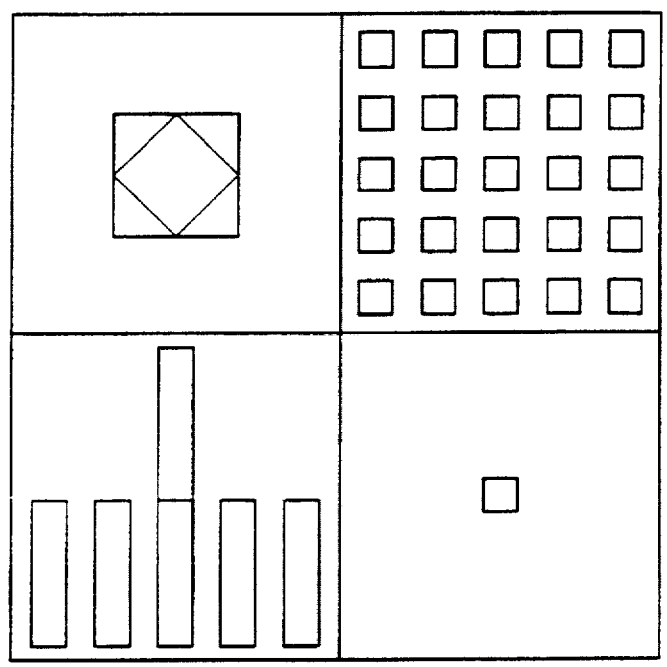
FIG. 10 is a view for explaining a mask pattern.

In Example 1, the 2D relative light intensity I(x,y) was found by simulation of the light intensity by scalar diffraction theory using the mask pattern shown in FIG. 10 and i-rays of a wavelength of 365 nm, and using exposure conditions of an NA of 0.57 and $\sigma$ of 0.6. Next, the amount of exposure D was multiplied with the relative light intensity I(x,y) to find the 2D light intensity distribution E(x,y)=D× I(x,y) actually obtained on the wafer. Next, the latent image formation intensity distribution was found by the following expression (9):

$$R(x,y) = \int\int_{-\infty}^{\infty} e^{-\{(x-xo)^2+(y-yo)^2\}/0.04} * E(xo,yo) dxo dyo \quad (9)$$

Figure 11:
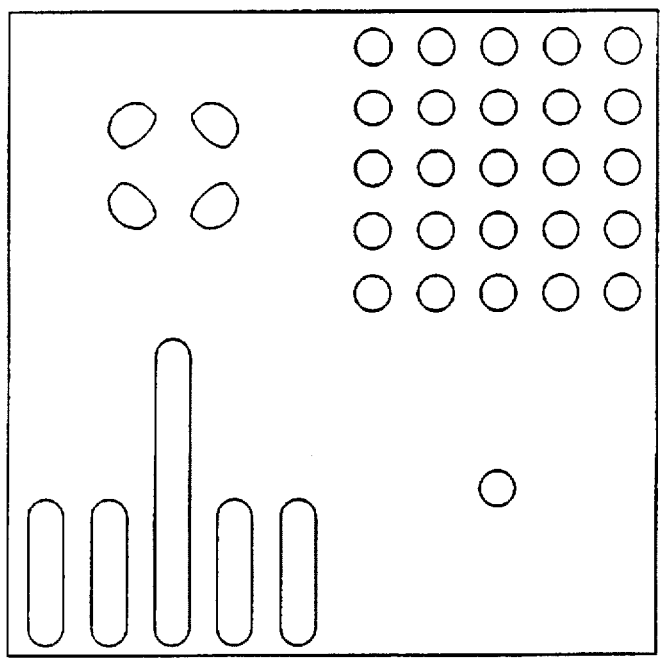
FIG. 11 is a view for explaining a resist pattern obtained by the method of estimating a resist pattern according to a first example.
Figure 12:
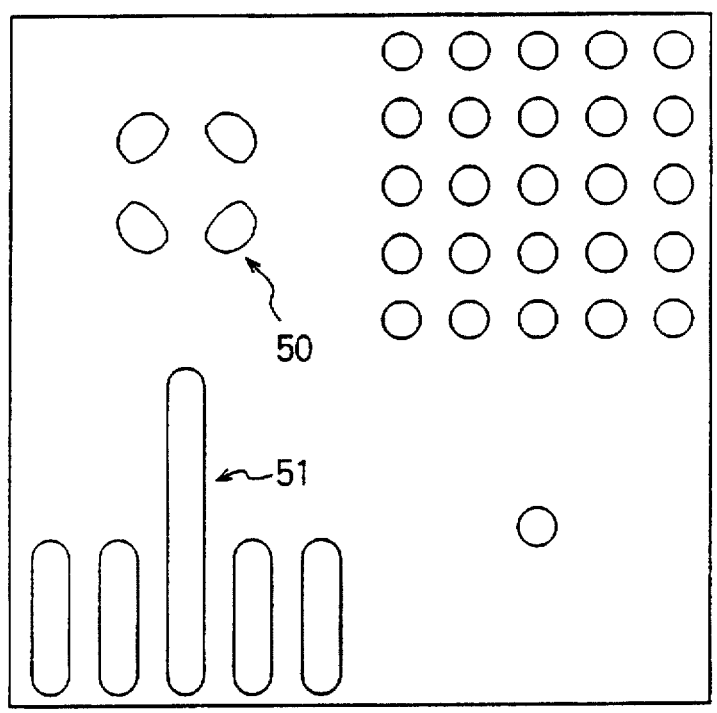
FIG. 12 is a view explaining a resist pattern obtained by actual experimentation.

Next, the contour R(x,y)=70 giving a latent image formation intensity of 70 mJ/cm² in the latent image formation intensity distribution defined by expression (9) was found and used as the resist pattern. FIG. 11 is a view showing a resist pattern found by this embodiment. The resist pattern shown in FIG. 11 is extremely similar to the resist pattern obtained by the experiment shown in FIG. 12.

EXAMPLE 2

In Example 2, i-rays of a wavelength of 365 nm were used to transfer patterns of contact holes of predetermined diameters under exposure conditions of an NA of 0.57 and a $\sigma$ of 0.6 for predetermined exposure times and at predetermined defocus conditions.

At this time, the transfer experiments were conducted for contact hole patterns of diameters of 0.40, 0.45, 0.50, and 0.55 μm for exposure times of 400, 600, 800, and 1200 msec and defocus conditions of 0.0, 0.2, 0.4, 0.6, 0.8, 1.0, and 1.2 μm. The diameters of the transferred contact holes were measured by SEM.

Next, the 2D relative light intensity I(x,y) was found by simulation of the light intensity using the scalar diffraction theory for the contact holes of the diameters of the above experiments using the above exposure conditions and defocus conditions. Next, the exposure time t and the amount of exposure Df per unit time were multiplied with the relative light intensity I(x,y) to find the 2D light intensity distribution E(x,y)=D×t×I(x,y) actually obtained on the wafer. Next, the latent image formation intensity distribution was found by the expression (7).

The contour R(x,y)=Eth gives a latent image formation intensity of Eth' Eth is a variable in the latent image formation intensity distribution for the resist pattern.

Next, the differences in diameters of contact holes were found for the resist patterns obtained by the method of estimation of the resist pattern and the resist patterns obtained by experiments for all of the conditions of the diameters of the contact hole patterns mentioned above, the exposure times, and the defocus conditions. The differences were squared and the square values were cumulatively added for all of the conditions. The processing was repeated to give the smallest cumulative sum and to thereby determine the constant α and the Eth. At this time, the constant α was determined to be 0.18 and the Eth 70 mJ/cm$^2$.

By estimating the resist pattern using the above expression (7) with the constant α and Eth values determined in the above way, the accuracy of estimation of the resist pattern was improved.

Further, in this case, by calculating the process margin of the contact holes of a diameter of 0.4 μm and finding the exposure conditions giving the greatest margin, while the depth of focus DOF according to the conventional techniques was 1.6 μm, a DOF of 2.6 μm was obtained with the present example—a greater DOF than in the past.

Consequently, while the yield of control holes in a conventional contact hole chain was 62 percent, according to the present embodiment, the yield became 98 percent. Therefore, it was possible to fabricate a semiconductor device with a high yield.

EXAMPLE 3

In Example 3, the method of estimation of the resist pattern of the above first embodiment was used to prepare a resist pattern. At this time, the constant α in expression (6) was made 0.131 and the Eth was made 197.01.

Further, in Example 3, in the L/S transfer experiment, use was made of i-rays of a wavelength of 365 nm to expose an i-ray positive resist of a Company a under exposure conditions of an NA of 0.50 and σ of 0.68 and changing the defocus conditions and the exposure time.

Figures 13, 14:
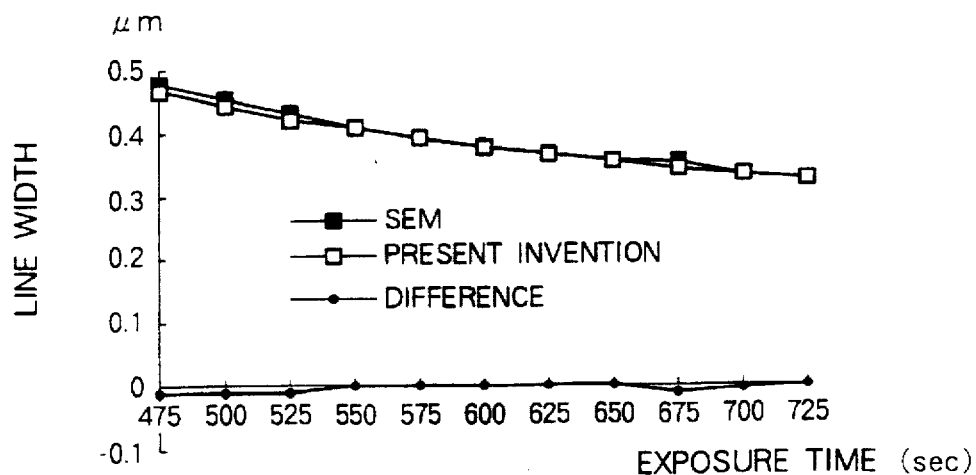
FIG. 13 is a view showing the correspondence between the line widths found in L/S transfer experiments at different defocus conditions and exposure times (SEM), the line widths found using the method of estimation of a resist pattern of a third example (present invention), and the differences between the line widths of the present invention and the line widths of the SEM.
FIG. 14 is a graph plotting the line widths of the present invention and the line widths of the SEM of FIG. 13 on the vertical axis and the exposure time on the horizontal axis.

FIG. 13 is a view showing the correspondence between the line widths found in L/S experiments at different defocus conditions and exposure times (SEM), the line widths found using the method of estimation of a resist pattern of a third example (present invention), and the differences between the line widths of the present invention and the line widths of the SEM.

FIG. 14 is a graph plotting the line widths of the present invention and the line widths of the SEM of FIG. 13 on the vertical axis and the exposure time on the horizontal axis.

From the results of the experiment shown in FIG. 13, in this example, 3σ=0.0153.

EXAMPLE 4

In Example 4, the method of estimation of the resist pattern of the above first embodiment was used to prepare a resist pattern. At this time, the constant α in expression (6) was made 0.149 and the Eth was made 135.46.

Further, in Example 4, in the L/S transfer experiment, use was made of i-rays of a wavelength of 365 nm to expose an i-ray positive resist of a Company B under exposure conditions of an NA of 0.50 and σ of 0.68 and changing the defocus conditions and the exposure time.

Figures 15, 16:
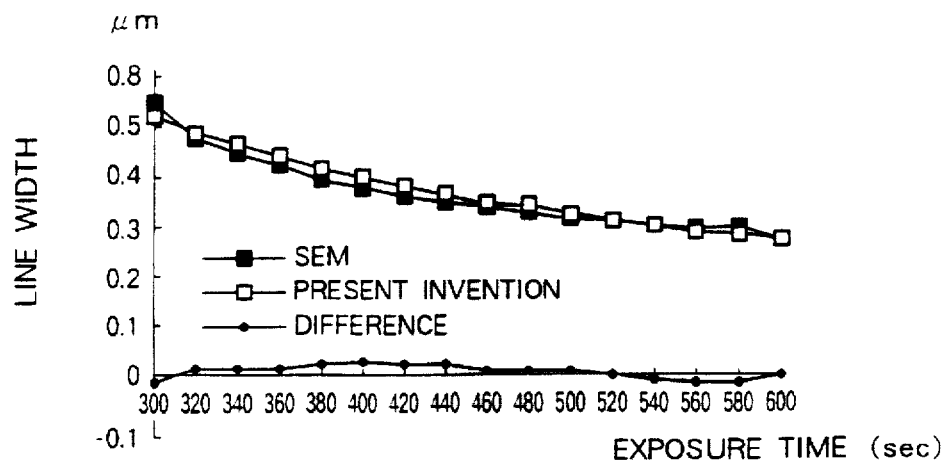
FIG. 15 is a view showing the correspondence between the line widths found in L/S transfer experiments at different defocus conditions and exposure times (SEM), the line widths found using the method of estimation of a resist pattern of a fourth example (present invention), and the differences between the line widths of the present invention and the line widths of the SEM.
FIG. 16 is a graph plotting the line widths of the present invention and the line widths of the SEM of FIG. 15 on the vertical axis and the exposure time on the horizontal axis.

FIG. 15 is a view showing the correspondence between the line widths found in L/S transfer experiments at different defocus conditions and exposure times (SEM), the line widths found using the method of estimation of a resist pattern of a fourth example (present invention), and the differences between the line widths of the present invention and the line widths of the SEM.

FIG. 16 is a graph plotting the line widths of the present invention and the line widths of the SEM of FIG. 15 on the vertical axis and the exposure time on the horizontal axis.

From the results of the experiment shown in FIG. 15, in this example, 3σ=0.0352.

Comparative Example 1

In Comparative Example 1, a conventional method of estimation of the resist pattern not using the latent image formation intensity was used to prepare a resist pattern. At this time, the Eth was made 193.54 when finding the resist pattern from the distribution of light intensity.

Further, in Comparative Example 1, in the transfer experiment, use was made of i-rays of a wavelength of 365 nm to expose an i-ray positive resist of a Company A under exposure conditions of an NA of 0.50 and σ of 0.68 and changing the defocus conditions and the exposure time.

Figures 17, 18:
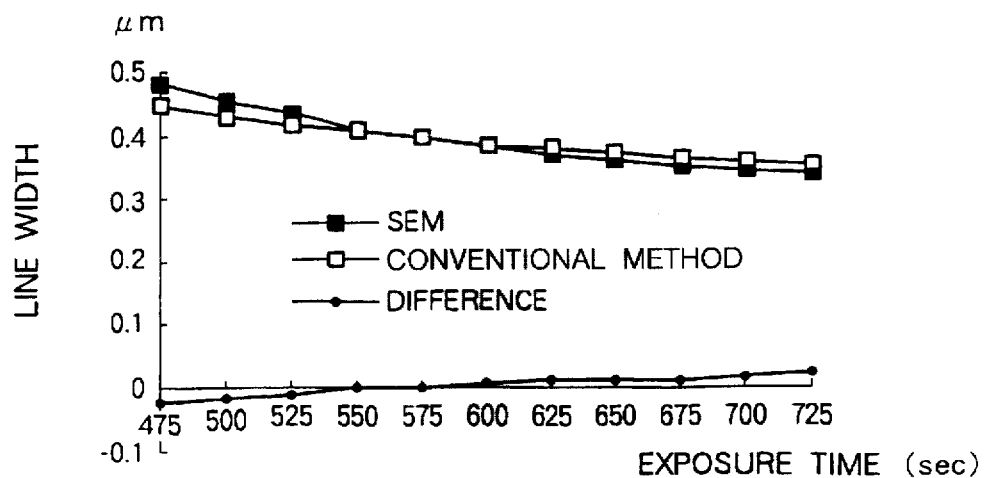
FIG. 17 is a view showing the correspondence between the line widths found in L/S transfer experiments at different defocus conditions and exposure times (SEM), the line widths found using the method of estimation of a resist pattern of Comparative Example 1 (conventional technique), and the differences between the line widths of the conventional technique and the line widths of the SEM.
FIG. 18 is a graph plotting the line widths of the conventional technique and the line widths of the SEM of FIG. 17 on the vertical axis and the exposure time on the horizontal axis.

FIG. 17 is a view showing the correspondence between the line widths found in L/S transfer experiments at different defocus conditions and exposure times (SEM), the line widths found using the method of estimation of resist pattern of Comparative Example 1 (conventional technique), and the differences between the line widths of the conventional technique and the line widths of the SEM.

FIG. 18 is a graph plotting the line widths of the conventional technique and the line widths of the SEM of FIG. 17 on the vertical axis and the exposure time on the horizontal axis.

From the results of the experiment shown in FIG. 17, in this comparative example, 3σ=0.0313.

Comparative Example 2

In Comparative Example 2, a conventional method of estimation of the resist pattern not using the latent image formation intensity was used to prepare a resist pattern. At this time, the Eth was made 130.45 when finding the resist pattern from the distribution of light intensity.

Further, in Comparative Example 2, in the L/S transfer experiment, use was made of i-rays of a wavelength of 365 nm to expose an i-ray positive resist of a Company B under exposure conditions of an NA of 0.50 and σ of 0.68 and changing the defocus conditions and the exposure time.

Figures 19, 20:
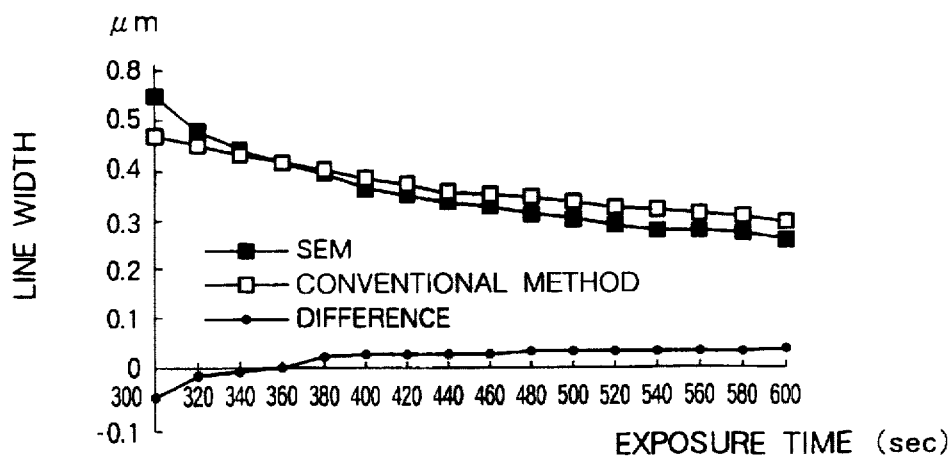
FIG. 19 is a view showing the correspondence between the line widths found in L/S transfer experiments at different defocus conditions and exposure times (SEM), the line widths found using the method of estimation of a resist pattern of Comparative. Example 2 (conventional technique), and the differences between the line widths of the conventional technique and the line widths of the SEM.
FIG. 20 is a graph plotting the line widths of the conventional technique and the line widths of the SEM of FIG. 19 on the vertical axis and the exposure time on the horizontal axis.

FIG. 19 is a view showing the correspondence between the line widths found in L/S transfer experiments at different defocus conditions and exposure times (SEM), the line widths found using the method of estimation of a resist pattern of Comparative Example 2 (conventional technique), and the differences between the line widths of the conventional technique and the line widths of the SEM.

FIG. 20 is a graph plotting the line widths of the conventional technique and the line widths of the SEM of FIG. 19 on the vertical axis and the exposure time on the horizontal axis.

From the results of the experiment shown in FIG. 19, in this comparative example, $3\sigma=0.0738$.

EVALUATION

In Example 3, the $3\sigma$ was able to be lowered compared with Comparative Example 1. Further, in Example 4, the $3\sigma$ was able to be lowered compared with Comparative Example 2. That is, according to Examples 3 and 4, compared with Comparative Examples 1 and 2, the difference between the results obtained by the method of estimation of a resist pattern and the results by SEM was smaller and it became possible to estimate the resist pattern with a high precision even for fine resist patterns.

As shown in FIG. 18 and FIG. 20, in Comparative Examples 1 and 2, there was a tendency for the line width of the SEM to be larger than the results of estimation of a resist pattern of Comparative Examples 1 and 2 with a short exposure time and for the line width of the SEM to be smaller than the results of the estimation of the resist pattern of Comparative Examples 1 and 2 with a long exposure time. As opposed to this, as shown in FIG. 14 and FIG. 16, in Examples 3 and 4, this tendency was able to be suppressed.

Further, according to Examples 3 and 4, compared with Comparative Example 1 and 2, the difference in the line width with the SEM could be made smaller overall even in the case of defocusing. Therefore, it is possible to reduce the effects of steps on the wafer surface on the results of estimation of the resist pattern.

As explained above, according to the method of estimation of a resist pattern and the method of exposure of the present invention, since the distribution of the latent image formation intensity used at the time of finding the resist pattern is determined by considering not only the light intensity of the noted point, but also the effects of the light intensities of the peripheral points on the exposure energy of the noted point, it is possible to calculate the resist pattern more accurately.

Although various minor changes and modifications might be proposed by those skilled in the art, it will be understood that my wish is to include within the claims of the patent warranted hereon all such changes and modifications as reasonably come within my contribution to the art.

What is claim is:

1. A method of estimation of a resist pattern which calculates a resist pattern formed by projecting a mask pattern on a resist on a wafer by exposure and then developing it, comprising the steps of:

calculating a 2D light intensity of an exposure light projected on the wafer based on the mask pattern and exposure conditions;

using light intensities at peripheral positions of any noted position on a 2D plane of said wafer and a distance between said noted position and said peripheral positions as a basis for calculating and cumulatively adding an effect of the light intensities at a plurality of said peripheral positions on exposure energy at said any noted position;

calculating a latent image formation intensity at said any noted position for the 2D plane of said wafer;

finding a distribution of said latent image formation intensity in the 2D plane of said wafer;

determining a threshold value of the latent image formation intensity corresponding to amount of exposure and development conditions; and finding a contour at said threshold value for the distribution of the latent image formation intensity and;

estimating the pattern defined by the contour as the resist pattern.

2. A method of estimation of a resist pattern as set forth in claim 1, wherein the method of calculating and cumulatively adding the effects on the exposure energy at said any noted position from said peripheral positions is to use the distance between said any noted position and peripheral positions as a viable and to use a product of a function using said variable and the light intensities at said peripheral positions to calculate and cumulatively add effects of the light intensities at a plurality of said peripheral positions and the function becoming greatest when the distance of said variable is 0, and the function becomes 0 when the distance is infinitely great.

3. A method of estimation of a resist pattern as set forth in claim 2, wherein the product of the function and the light intensities at said peripheral positions is a product of said function and a power of the light intensities at said peripheral positions.

4. A method of estimation of a resist pattern as set forth in claim 2, wherein said function is a Gaussian function.

5. A method of estimation of a resist pattern as set forth in claim 2, further including a step of determining said function so that the resist pattern estimated by said method of estimation of a resist pattern matches an actual resist pattern found by experimentation, and the resist pattern being calculated once again based on said determined function.

6. A method of estimation of a resist pattern as set forth in claim 5, wherein said step of determining said function is achieved by finding and adding squares of differences in line widths between said calculated resist pattern and said resist pattern found by experimentation at a plurality of corresponding positions, and determining the function giving a smallest sum of the addition.

7. A method of estimation of a resist pattern as set forth in claim 5, wherein said step of determining said function is achieved by finding maximum values of difference in line widths between said calculated resist pattern and said resist pattern found by experimentation at a plurality of corresponding positions, and determining the function so as to give a smallest maximum value.

8. A method of exposure for projecting a mask pattern on a resist on a wafer by exposure, comprising the steps of:

using light intensities at peripheral positions of any position noted on a 2D plane of said wafer and a distance between said noted position and said peripheral positions as a basis for calculating and cumulatively adding an effect of the light intensities at a plurality of said peripheral positions on exposure energy at said any noted position;

calculating a latent image formation intensity at said any noted position for the 2D plane of said wafer;

finding a distribution of said latent image formation intensity in the 2D plane of said wafer;

determining a threshold value of the latent image formation intensity corresponding to an amount of exposure and development conditions;

finding a contour at said threshold value for the distribution of the latent image formation intensity;

estimating a pattern defined by the contour as a desired resist pattern;

determining at least one of said mask pattern and exposure conditions so that said estimated resist pattern becomes close to the desired resist pattern; and exposing by projecting said mask pattern using said exposure conditions.

9. A method of exposure as set forth in claim 8, wherein said determined mask pattern performs on a design mask pattern at least one of addition of a predetermined modified pattern, correction of a line width, and addition of a subresolution pattern.

10. A method of exposure as set forth in claim 8, wherein said determined conditions determine at least one of an exposure wavelength $\lambda$, a partial coherence $\sigma$, and a numerical aperture NA.

11. A method of exposure as set forth in claim 8, wherein the method of calculating and cumulatively adding the effects on the exposure energy at said any noted position from said peripheral positions is to use the distance between said any noted position and peripheral positions as a variable and to use a product of a function using said variable and the light intensities at said peripheral positions to calculate and cumulatively add effects of the light intensities at a plurality of said peripheral positions and the function becoming greatest when a distance of said variable is 0, and the function becomes 0 when the distance is infinitely great.

12. A method of exposure as set forth in claim 11, wherein the product of the function and the light intensity at said peripheral position is a product of said function and a power of the light intensities at said peripheral positions.

13. A method of exposure as set forth in claim 11, wherein said function is a Gaussian function.

* * * * *